US012100691B2

(12) United States Patent
Herrmann

(10) Patent No.: US 12,100,691 B2
(45) Date of Patent: Sep. 24, 2024

(54) LIGHT-EMITTING COMPONENT AND DISPLAY DEVICE COMPRISING THE SAME

(71) Applicant: OSRAM Opto Semiconductors GmbH, Regensburg (DE)

(72) Inventor: Siegfried Herrmann, Neukirchen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 414 days.

(21) Appl. No.: 17/438,776

(22) PCT Filed: May 13, 2020

(86) PCT No.: PCT/EP2020/063371
§ 371 (c)(1),
(2) Date: Sep. 13, 2021

(87) PCT Pub. No.: WO2020/229558
PCT Pub. Date: Nov. 19, 2020

(65) Prior Publication Data
US 2022/0165715 A1 May 26, 2022

(30) Foreign Application Priority Data
May 15, 2019 (DE) .......................... 102019112733.5

(51) Int. Cl.
*H01L 25/075* (2006.01)
*H01L 25/16* (2023.01)
(Continued)

(52) U.S. Cl.
CPC ........ *H01L 25/0753* (2013.01); *H01L 25/167* (2013.01); *H01L 33/52* (2013.01); *H01L 33/60* (2013.01); *H01L 33/62* (2013.01)

(58) Field of Classification Search
CPC ... H01L 25/0753; H01L 25/167; H01L 33/52; H01L 33/60; H01L 33/62; H01L 33/486;
(Continued)

(56) References Cited

U.S. PATENT DOCUMENTS

2011/0163683 A1 7/2011 Steele et al.
2012/0113673 A1 5/2012 Na et al.
(Continued)

FOREIGN PATENT DOCUMENTS

| DE | 102017114668 A1 | 1/2019 |
| DE | 102017123290 A1 | 4/2019 |
| EP | 3343273 A2 | 7/2018 |

OTHER PUBLICATIONS

International Search Report for International Patent Application No. PCT/EP2020/063371, dated Aug. 3, 2020 (8 pages).

*Primary Examiner* — Anne M Hines
*Assistant Examiner* — Jose M Diaz
(74) *Attorney, Agent, or Firm* — ARENTFOX SCHIFF LLP

(57) ABSTRACT

The invention relates to a light-emitting component comprising a light-emitting semiconductor chip, a transparent conductive layer, and at least two electrical connection points, wherein the transparent conductive layer covers the light-emitting semiconductor chip at least in places, and the electrical connection points are arranged on a side of the light-emitting semiconductor chip facing away from the transparent conductive layer.

17 Claims, 10 Drawing Sheets

(51) Int. Cl.
*H01L 33/52* (2010.01)
*H01L 33/60* (2010.01)
*H01L 33/62* (2010.01)

(58) Field of Classification Search
CPC ....... H01L 33/56; H01L 33/04; H10K 50/156; H10K 50/166; H10K 50/84; H10K 50/841; H10K 50/844; H10K 50/167
See application file for complete search history.

(56) References Cited

U.S. PATENT DOCUMENTS

2014/0367633 A1   12/2014  Bibl et al.
2017/0162553 A1*  6/2017  Bibl ...................... H01L 33/501
2018/0342691 A1   11/2018  Lu

* cited by examiner

A)

B)

LIGHT-EMITTING COMPONENT AND DISPLAY DEVICE COMPRISING THE SAME

This application is a 35 U.S.C. § 371 National Phase of PCT Application No. PCT/EP2020/063371, filed on May 13, 2020, which claims priority to German Patent Application No. 102019112733.5, filed May 15, 2019, the disclosures of each of which are hereby incorporated by reference herein in their entireties.

The invention relates to a light-emitting component and a display device.

It is an object of the present disclosure to specify a light-emitting component which has a particularly compact design. Another object is to specify a display device comprising such a light-emitting component.

The light-emitting component is designed to emit visible light in particular during operation. The visible light may be colored or white light, for example. Furthermore, it may be possible that the light-emitting component is designed to generate colored and white light.

According to at least one embodiment, the light-emitting component comprises a light-emitting semiconductor chip. The light-emitting semiconductor chip is, for example, a luminescent diode chip. Luminescent diode chip may be a light-emitting diode chip or a laser diode chip. The light-emitting semiconductor chip is designed to emit colored light, for example red, green, or blue light, during operation. Furthermore, the light-emitting semiconductor chip may comprise a conversion element, such that the light-emitting semiconductor chip is designed to emit mixed radiation, for example white light.

According to at least one embodiment, the light-emitting component comprises a transparent conductive layer. For example, the transparent conductive layer is formed with a TCO (Transparent Conductive Oxide) material. For example, the transparent conductive layer may be formed with materials such as ITO or ZnO.

Transparent means here and in the following that a transparent element of the component is transparent to the electromagnetic radiation generated by the light-emitting semiconductor chip. The transparent element does not necessarily have to be clear transparent, but it is possible that the transparent element transmits part of the electromagnetic radiation. In other words, the transparent element can be designed to be radiation-scattering, absorbing for part of the electromagnetic radiation, reflecting or converting. However, it is also possible for the transparent element to be clear transparent.

According to at least one embodiment, the light-emitting component comprises at least two electrical connection points. Via the electrical connection points, the component can be electrically contacted and, if necessary, controlled from the outside. The electrical connection points can, for example, be electrically contactable via a solder material and/or an electrically conductive adhesive and/or a wire connection.

According to at least one embodiment of the light-emitting component, the transparent conductive layer covers the light-emitting semiconductor chip at least in places. This means that the transparent conductive layer is arranged above the light-emitting semiconductor chip, for example, and extends partially or completely over the light-emitting semiconductor chip.

In particular, the transparent conductive layer is then arranged such that at least a portion of the light generated in the semiconductor chip during operation exits the light-emitting component through the transparent conductive layer.

The transparent conductive layer can completely cover the light-emitting semiconductor chip or it can cover the light-emitting semiconductor chip only in certain areas.

In the event that the transparent conductive layer completely covers the semiconductor chip, the transparent conductive layer can be formed in an unstructured manner and over a large area and is particularly easy to manufacture in this way.

In the event that the transparent conductive layer covers the semiconductor chip only in places, it is necessary to structure the layer, but this can save material for the transparent conductive layer, which can be advantageous in terms of the cost of the light-emitting component.

According to at least one embodiment of the light-emitting component, the electrical connection points are arranged on a side of the transparent, conductive layer facing away from the light-emitting semiconductor chip. This means that the transparent conductive layer is located, for example, above the light-emitting semiconductor chip and the electrical connection points are then located below the light-emitting semiconductor chip. In this case, at least one of the electrical connection points is electrically conductively connected to at least one region of the transparent conductive layer.

In particular, in the case of the light-emitting component described here, it is possible for all the electrical connection points of the component to be arranged on a single side of the component, namely the side of the semiconductor chip facing away from the transparent conductive layer. In this way, the light-emitting component can be a surface-mountable light-emitting component, which can be mechanically fixed and electrically conductively connected at its destination with the electrical connection points via a surface mounting technique. Light is then coupled out of the light-emitting component on the side of the component facing away from the connection points, at least partially through the transparent conductive layer.

According to at least one embodiment of the light-emitting component, the light-emitting component comprises a light-emitting semiconductor chip, a transparent conductive layer, and at least two electrical connection points. The transparent conductive layer covers the light-emitting semiconductor chip at least in places, and the electrical connection points are arranged on a side of the transparent conductive layer facing away from the light-emitting semiconductor chip.

For display devices in which light-emitting components such as light-emitting diodes form the imaging elements, and for particularly small RGB (red, green, blue) applications, mounting platforms for particularly small light-emitting semiconductor chips are desirable. The light-emitting component described here offers the possibility of mounting light-emitting semiconductor chips in a particularly compact way in a component. The light-emitting semiconductor chips have edge lengths of at most 100 µm, in particular at most 60 µm or at most 30 µm. The light-emitting component can be surface-mounted with the electrical connection points, which are all arranged on a side of the transparent conductive layer facing away from the light-emitting semiconductor chip, and can therefore be fixed and connected at its destination particularly easily. No submount (for example, an interposer) is required for the light-emitting component, which can greatly reduce the cost of the light-emitting component. Furthermore, the light-emitting component is characterized by a particularly compact, thin and mechanically flexible design. This means that the light-emitting component can also be used in a particularly variable manner.

According to at least one embodiment of the light-emitting component, the light-emitting component comprises a transparent carrier which completely covers the transparent conductive layer, the light-emitting semiconductor chip and the electrical connection points.

The transparent carrier is a mechanically supporting element of the light-emitting component. This means that the transparent carrier increases the mechanical stability of the light-emitting component compared to a light-emitting component without this carrier. The transparent carrier may be formed by a glass plate, for example. Alternatively or additionally, it is possible for the transparent carrier to comprise or be formed from a plastic material. For example, the transparent carrier may be formed by a plastic film. Further, it is possible that the transparent carrier is formed by a laminate of at least one plastic film and a glass plate.

The transparent carrier is characterized, for example, by a particularly low thickness. The thickness is formed in a direction perpendicular to the main extension direction of the transparent carrier. For example, the thickness is between at least 0.2 µm and at most 40 µm, in particular at most 25 µm. The light-emitting component can have a total thickness of, for example, at most 50 µm, in particular at most 35 µm. The edge length of the light-emitting component is, for example, at most 180 µm. The edge length of the light-emitting component corresponds, for example, to the edge length of the transparent carrier, which in this case covers all elements of the component. "Covers" in this case means that no element of the light-emitting component projects laterally beyond the carrier. For example, at least some of the electrical connection points may be laterally flush with the carrier, or the carrier may project laterally beyond the electrical connection points.

The carrier may have optical elements formed in or applied to the carrier on its side facing and/or facing away from the semiconductor chip. For example, the optical elements may be outcoupling structures that facilitate light exit from the light-emitting component by lowering the probability of total reflection at the exit surface. It is further possible, for example, that at least one trench is introduced into the carrier on its side facing and/or facing away from the semiconductor chip, which trench partially or completely surrounds the semiconductor chip in lateral directions. The trench can be filled with a light-absorbing or light-reflecting material or the carrier is coated with such a material at the interface to the trench. In this way, the beam path can be limited or shaped. The trench can be created, for example, by etching, punching or embossing in the carrier.

According to at least one embodiment of the light-emitting component, the light-emitting semiconductor chip is completely surrounded by a chip encapsulation body in lateral directions. The chip encapsulation body is formed with an electrically insulating material. The chip encapsulation body may be reflective and/or transparent to the electromagnetic radiation emitted from the light-emitting semiconductor chip during operation. The chip encapsulation body surrounds the light-emitting semiconductor chip on all side surfaces of the light-emitting semiconductor chip. For example, it is possible that the chip encapsulation body is flush with a top surface facing the transparent conductive layer and/or a bottom surface of the light-emitting semiconductor chip facing away from the transparent conductive layer. The chip encapsulation body protects the light-emitting semiconductor chip from mechanical and/or chemical damage. Furthermore, the chip encapsulation body increases an area available for applying the electrical connection points of the light-emitting component.

The chip encapsulation body forms, for example, a frame around the light-emitting semiconductor chip. A cross-sectional area of the composite of chip encapsulation body and light-emitting semiconductor chip in a plane parallel to the main extension plane of the component is, for example, at most four times, in particular at most three times, as large as the cross-sectional area of the semiconductor chip in the same plane. In other words, the chip encapsulation body increases the cross-sectional area and thus the contact area for the electrical connection points of the light-emitting component. However, the chip encapsulation body does not cover the entire carrier on its underside. If several semiconductor chips are present in the component, then the chip encapsulation bodies associated with the semiconductor chips are preferably spaced apart from one another in lateral directions and are not integrally connected to one another.

The chip encapsulation body may be formed with a plastic material such as parylene, epoxy resin and/or silicone. Furthermore, it is possible that the chip encapsulation body is formed with electrically insulating materials such as silicon oxide and/or silicon nitride.

The light-emitting semiconductor chip can in particular be arranged between one of the at least two electrical connection points and the transparent conductive layer, wherein this electrical connection point covers an underside of the chip encapsulation body facing away from the transparent conductive layer. The electrical connection point can then be directly electrically conductively connected to the light-emitting semiconductor chip and extend beyond a contact point of the light-emitting semiconductor chip to the underside of the chip encapsulation body. In this way, the light-emitting semiconductor chip is integrated, so to speak, into a bond pad or connection point of the light-emitting component. The chip encapsulation body then serves, among other things, to increase the area available for the electrical connection point parallel to a main extension plane of the light-emitting component. In this way, for example, heat generated in the semiconductor chip during operation can be dissipated particularly efficiently through the electrical connection point. In particular, the electrical connection point then has a larger area than the light-emitting semiconductor chip.

According to at least one embodiment of the light-emitting component, the light-emitting semiconductor chip is surrounded in lateral directions by an electrically conductive lead frame which is in direct mechanical and electrical contact with the transparent conductive layer. The electrically conductive lead frame is formed with, for example, a metal such as gold, aluminum, copper, and/or silver, or contains at least one of these metals. The electrically conductive lead frame may be formed as a thin layer on the transparent conductive layer on the side facing the semiconductor chip. The transparent conductive layer has, for example, a relatively low transverse conductivity. By means of the lead frame, the overall transverse conductivity can be increased so that the light-emitting semiconductor chip can be connected with particularly low electrical resistance.

According to at least one embodiment of the light-emitting component, the light-emitting component comprises a conductive body which is covered by the transparent conductive layer at least in places and is electrically conductively connected thereto. The conductive body is, for example, a metal body or a body formed with a doped semiconductor material. Furthermore, it is possible that the electrically conductive body is a solder bump. In particular, one of the at least two electrical connection points covers the conductive body in places on its underside facing away from the transparent conductive layer, or the underside of the conductive body forms one of the at least two electrical connection points. The electrically conductive body can then be electrically conductively connected to the light-emitting semiconductor chip of the component via the transparent conductive layer. A connection of the light-emitting component can then be made, for example, via the electrical connection point that is directly connected to the light-emitting semiconductor chip and via the electrical connection point that is formed on or by the electrically conductive body.

According to at least one embodiment of the light-emitting component, the electrically conductive lead frame is electrically conductively connected to the conductive body via a conductor path, the conductor path being in direct mechanical and electrical contact with the transparent conductive layer. The conductor path may be formed with the same material as the lead frame. For example, the conductor path extends from the conductive body along the transparent conductive layer to the lead frame. The conductor path serves to increase the transverse conductivity of the composite of the transparent conductive layer and the conductor path. In this way, the light-emitting semiconductor chip can be electrically connected to the electrical connection point formed on or by the conductive body with particularly low electrical resistance.

According to at least one embodiment of the light-emitting component, the light-emitting component comprises an active element, wherein the transparent conductive layer covers the active element at least in places and the active element is electrically conductively connected to the light-emitting semiconductor chip. For example, a connection of the active element to the light-emitting semiconductor chip can be established via the transparent conductive layer and/or a conductor path that is in direct mechanical and electrical contact with the transparent conductive layer.

The active element can be an element that is provided for driving the light-emitting semiconductor component. In particular, the active element can comprise a thin-film transistor or be formed by a thin-film transistor for this purpose.

The active element is arranged, for example, between the light-emitting semiconductor chip and the conductive body. Preferably, the active element is so thin that it does not project beyond the electrical connection points in a direction away from the transparent conductive layer, but is at most flush with them.

With the active element, an active control element is integrated in the light-emitting component. If the light-emitting component comprises several light-emitting semiconductor chips, for example, these can be controlled by means of the active element.

The active element is particularly well protected against external mechanical and chemical influences by the transparent conductive layer and, if present, the transparent carrier. The fact that the active element does not project beyond the electrical connection points on the underside means that a particularly compact, thin light-emitting component is specified.

According to at least one embodiment, the light-emitting component comprises an encapsulation body which partially covers the light-emitting semiconductor chip, the transparent conductive layer and, if present, the transparent carrier. The encapsulation body extends, for example, on the underside of the transparent conductive layer facing away from the light-emitting semiconductor chip over the entire surface of the light-emitting component.

If a transparent carrier is present, the encapsulation body can then be flush with it at its side surfaces or project beyond and cover the side surfaces of the transparent carrier. On the side of the transparent conductive layer facing away from the semiconductor chip, however, the light-emitting component is free of the encapsulation body.

The encapsulation body can be transparent, radiation-absorbing or radiation-reflecting. For example, the encapsulation body is black and thus increases a contrast of the light-emitting semiconductor chip to the surroundings.

The encapsulation body is formed with an electrically insulating material. This means that the encapsulation body comprises at least one electrically insulating matrix material into which, for example, particles of further materials provided for adjusting the optical properties of the encapsulation material can be incorporated.

In particular, the encapsulation body may contain or consist of parylene. Furthermore, it is possible to use other inorganic materials, such as silicone and/or epoxy resin, to form the encapsulation body.

During the manufacture of the light-emitting component, the encapsulation body can also be applied over the entire surface, also covering the light-emitting semiconductor chips, for example, and subsequently opened by removing material in order to connect the electrical connection points to the semiconductor chip and/or the conductive body.

It is possible that the encapsulation body is applied in such a way that a thermal and chemical shrinkage of the layer takes place, whereby a mechanical pressure is exerted on the light-emitting chip by the encapsulation body in the direction of the transparent conductive layer and, if present, the transparent conductive carrier. In this way, the encapsulation body can improve a mechanical connection of the light-emitting semiconductor chip in the light-emitting component.

If a chip encapsulation body is present in the light-emitting component, this can also be covered by the encapsulation body at least in places. The encapsulation body can then be flush with the light-emitting semiconductor chip and/or the chip encapsulation body in a direction from the transparent conductive layer to the connection points, so that only the connection points project beyond the encapsulation body on the underside of the light-emitting component.

According to at least one embodiment of the light-emitting component, the encapsulation body covers the active element. In this case, it is possible for the encapsulation body to completely cover the active element on its side facing away from the transparent conductive layer, so that the active element is completely protected by the encapsulation body and is not visible from the outside. The encapsulation body then serves to protect the active element mechanically and chemically from external influences.

Overall, the encapsulation body may represent a mechanically supporting element of the light-emitting component. In particular, if the light-emitting component does not comprise a transparent carrier, the encapsulation body represents the supporting element of the light-emitting component, which mechanically supports and carries the light-emitting component. Without the encapsulation body, there would then be no mechanical stability of the light-emitting component.

According to at least one embodiment, the light-emitting semiconductor chip is completely surrounded by a chip encapsulation body in lateral directions and on a side facing away from the transparent conductive layer. In this case, no electrical connection point is attached to the chip encapsulation body and the chip encapsulation body is not penetrated by an electrical lead to the chip on the side of the chip facing away from the transparent conductive layer. In this way, the light-emitting chip is particularly well protected from external chemical influences and mechanical damage by the chip encapsulation body.

In particular, the chip encapsulation body in this embodiment may be transparent or reflective to the electromagnetic radiation emitted from the surrounding light-emitting chip during operation.

According to at least one embodiment, the chip encapsulation body is covered by a reflector. The reflector is, for example, a reflective coating, which may be formed by a metallic layer, a layer of reflective particles such as titanium oxide, or as a dielectric mirror or Bragg mirror. Furthermore, it is possible that the reflector is formed by the encapsulation body. The reflector is designed to reflect the electromagnetic radiation emitted from the light-emitting semiconductor chip toward the transparent conductive layer.

In the case of a light-emitting component described here, it is possible in particular for it to comprise two or more light-emitting semiconductor chips. The light-emitting semiconductor chips can each be integrated in the same way in the component, as described here for the light-emitting semiconductor chip. An active element may be arranged between adjacent light-emitting semiconductor chips in each case, or exactly one active element may be present in the light-emitting component. The light-emitting semiconductor chips may differ from each other in terms of their composition and in terms of shape and size. For example, it is possible that the light-emitting component comprises a red light-emitting semiconductor chip, a blue light-emitting semiconductor chip, and a green light-emitting semiconductor chip. In this way, the light-emitting component can be used as a pixel in a display device. If the light-emitting component additionally comprises an active element, it is possible that the light-emitting component is an actively drivable pixel of a display device.

In addition, a display device is specified. The display device comprises at least one, in particular a plurality of the light-emitting components described herein. The light-emitting components preferably each form a pixel, i.e. an imaging element of the display device. If the light-emitting component comprises a plurality of light-emitting semiconductor chips, these may, for example, form different-colored subpixels of the pixel. In this case, the light-emitting components may be connected to each other, for example, via a common encapsulation body, or they may be present in the display device at a distance from each other. All features described here for the light-emitting component are also disclosed for the display device and vice versa.

In the following, light-emitting components described herein, as well as display devices described herein, are explained in more detail with reference to exemplary embodiments and the associated figures.

BRIEF DESCRITPION OF THE DRAWINGS

In connection with the schematic illustrations of FIGS. 1A, 1B, 1C, 1D, 2A, 2B, 2C, 3, 4, 5A, 5B, 5C, 5D, 5E, 5F, 6, 7, exemplary embodiments of light-emitting components described herein are explained in more detail.

Figure 8:
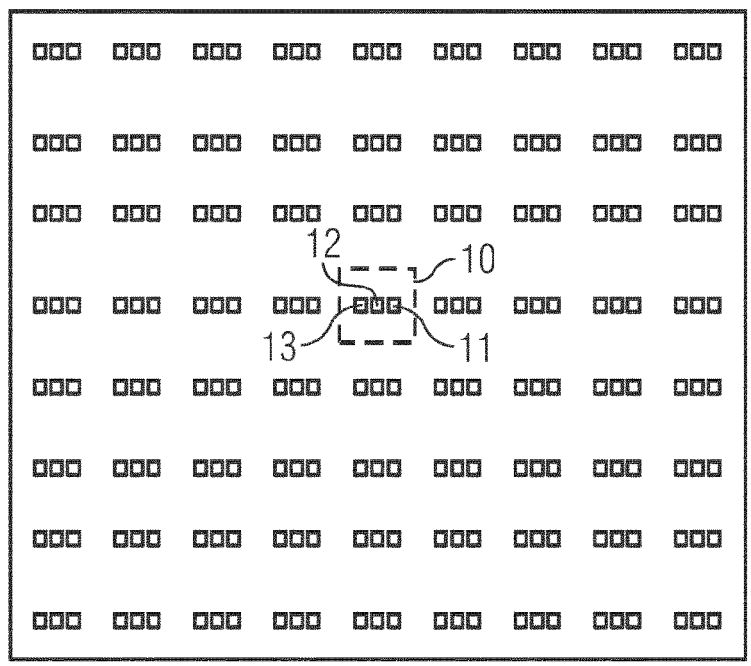
FIG. 8 illustrates an example of a display device according to aspects of the present disclosure.

In connection with the schematic illustration of FIG. 8, an exemplary embodiment of a display device described herein is explained in more detail.

In connection with the schematic illustrations of FIGS. 9A, 9B, 10A, 10B, 10C, exemplary embodiments of light-emitting components described herein are explained in more detail.

In connection with the schematic illustrations of FIGS. 11A, 11B, 11C, 11D, an exemplary embodiment of a method of manufacturing an exemplary embodiment of a display device described herein is explained in more detail.

Figure 12:
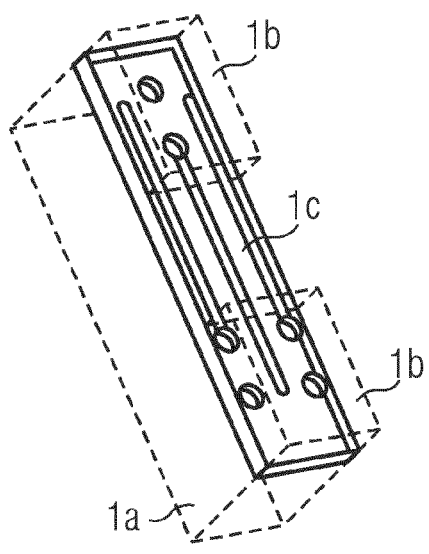
FIGS. 12A-12B illustrate an example of radiation-emitting semiconductor chips according to aspects of the present disclosure.
Figure 12:
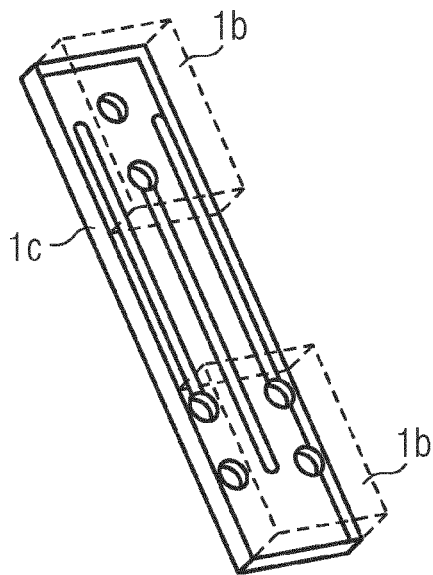

In connection with the schematic illustrations of FIGS. 12A and 12B, light-emitting semiconductor chips for exemplary embodiments of light-emitting components and display devices described herein are explained in more detail.

Figure 13:
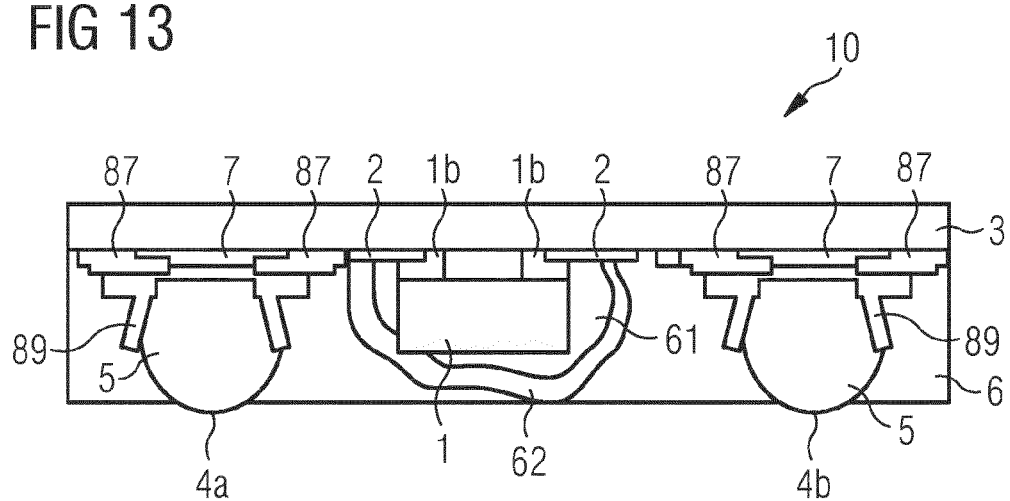
FIG. 13 illustrates an example of a seventh light-emitting component according to aspects of the present disclosure.

In connection with the schematic illustration of FIG. 13, an exemplary embodiment of a light-emitting component described herein is explained in more detail.

Identical, similar or equivalent elements are provided with the same reference signs in the figures. The figures and the proportions of the elements shown in the figures are not to be regarded as true to scale. Rather, individual elements, in particular layer thicknesses, may be shown exaggeratedly large for better representability and/or understanding.

Figure 1A:
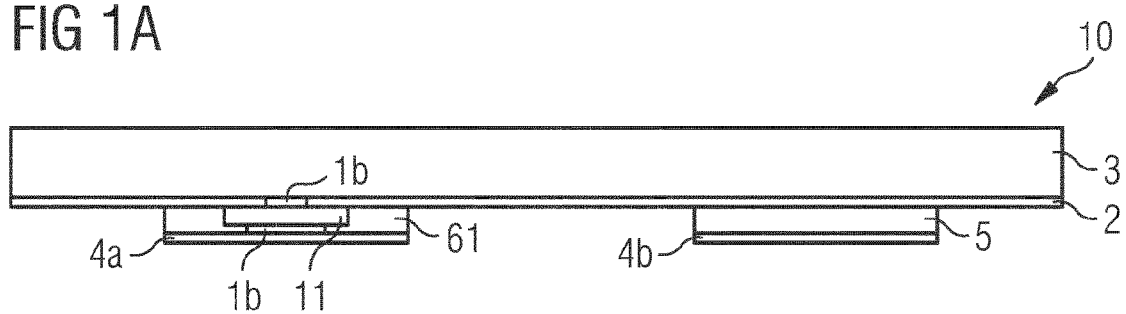
FIGS. 1A-1D illustrate an example of a first light-emitting component according to aspects of the present disclosure.
Figure 1B:
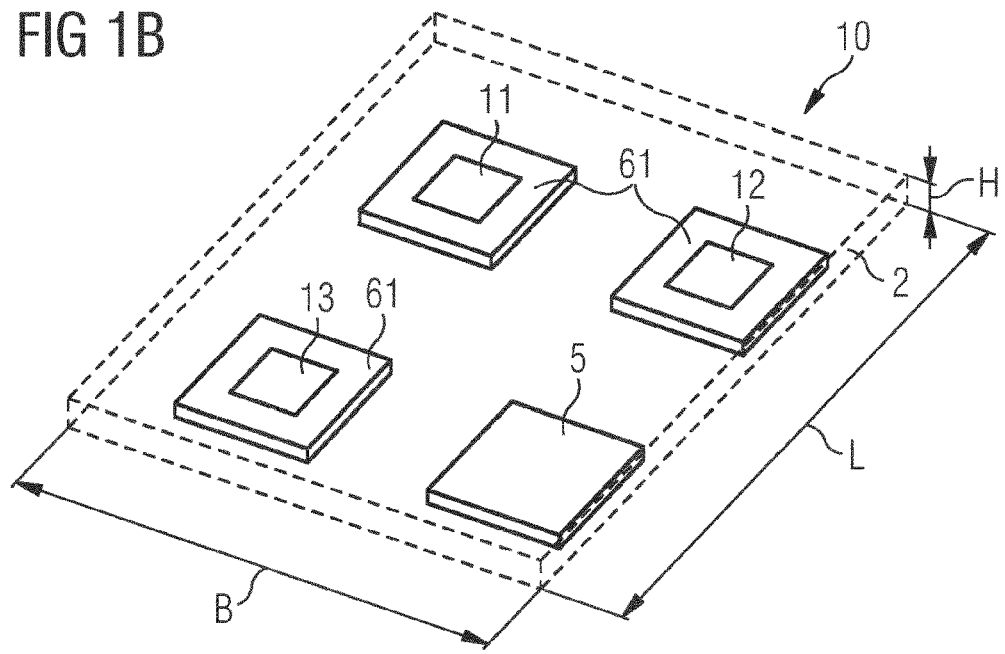
Figure 1C:
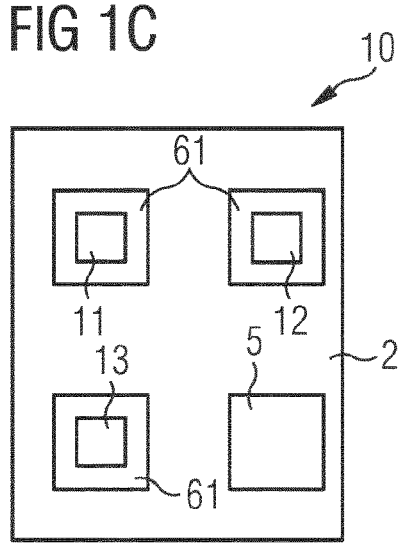
Figure 1D:
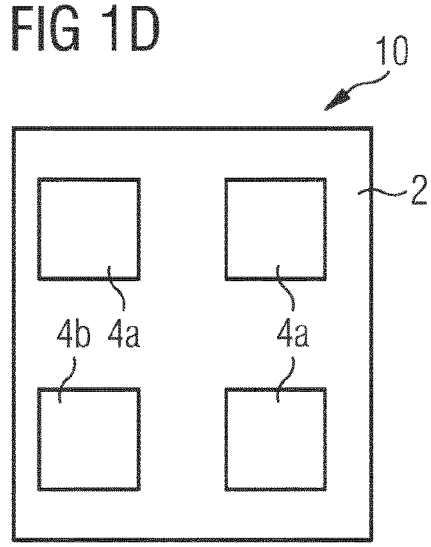

In connection with the schematic illustrations of FIGS. 1A to 1D, an exemplary embodiment of a light-emitting component described herein is explained in more detail. FIG. 1A shows a schematic sectional view along the sectional line drawn in the schematic perspective view of FIG. 1B. FIG. 1C shows a schematic top view of a top surface of the light-emitting component, and FIG. 1D shows a schematic top view of a bottom surface of the light-emitting component.

In the light-emitting component shown in FIGS. 1A to 1D, three light-emitting semiconductor chips 11, 12, 13 are arranged in the light-emitting component. A transparent conductive layer 2 formed with ITO, for example, is arranged on the upper side of the light-emitting semiconductor chips 11, 12, 13. Above the transparent conductive layer 2, a transparent carrier 3 follows, which completely covers the transparent conductive layer 2, the light-emitting semiconductor chips 11, 12, 13 and the electrical connection points 4a, 4b. The transparent carrier 3 is optional.

The carrier 3—if present—can be formed with a plastic material or preferably with a glass. In this way, it is possible for the carrier 3 to have a particularly scratch-resistant surface.

The light-emitting semiconductor chips 11, 12, 13 are, for example, a blue light-emitting semiconductor chip 11, a red light-emitting semiconductor chip 12, and a green light-emitting semiconductor chip 13. The light-emitting semiconductor chips 11, 12, 13 in this exemplary embodiment are vertical light-emitting diode chips with terminals 1b at the upper side and underside of each chip.

Each of the semiconductor chips 11, 12, 13 is completely surrounded in lateral directions by a chip encapsulation body 61 formed, for example, with an electrically insulating material such as silicone, epoxy resin and/or parylene. A first electrical connection point 4a formed with an electrically conductive material such as gold, silver, aluminum and/or copper is arranged across the entire underside of each light-emitting semiconductor chip 11, 12, 13 and the surrounding chip encapsulation body 61.

An adhesion-promoting layer, which may be formed with silicon dioxide and/or silicon nitride, for example, may be arranged between the chip encapsulation body 61 and the electrical connection point 4a. Thus, in the component of FIGS. 1A to 1D, the light-emitting semiconductor chips 11, 12, 13 are integrated into a bond pad or a connection point of the light-emitting component. For example, the light-emitting semiconductor chips may each be contacted on the p-side via the associated connection point 4a.

The n-side contact can then be made via a conductive body 5, which is designed as a solid metal body, for example. The conductive body 5 is electrically conductively connected to all light-emitting semiconductor chips 11, 12, 13 via the transparent conductive layer 2. A second electrical connection point 4b is formed on the side of the conductive body 5 facing away from the transparent conductive layer 2. The first lateral dimension B of the light-emitting component is 140.4 µm, for example, and the second lateral dimension L is 175.5 µm, for example. The edge length of the semiconductor chips 11, 12, 13 is 22.5 µm each, for example. The total height H of the light-emitting component with carrier 3 is 35 µm, for example. Further components not shown, such as active elements, optical sensors, thermal sensors and the like, can be integrated in the component.

Figure 2A:
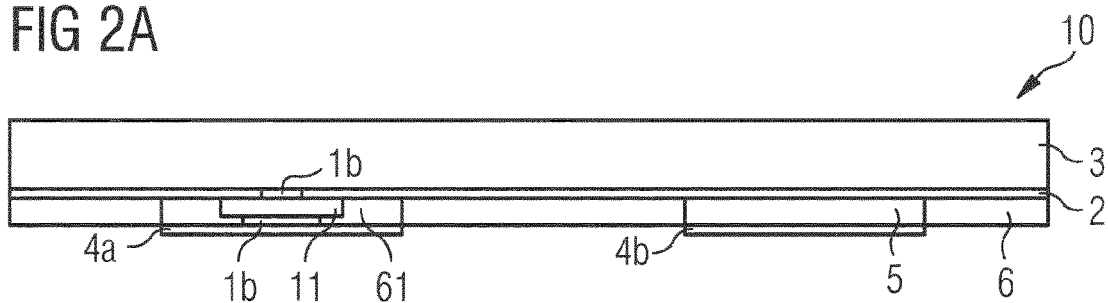
FIGS. 2A-2C illustrate an example of a second light-emitting component according to aspects of the present disclosure.

In contrast to the exemplary embodiment of FIGS. 1A to 1D, a further exemplary embodiment of a light-emitting component described herein is explained in more detail in connection with FIGS. 2A to 2C, in which the semiconductor chips 11, 12, 13 with their chip encapsulation bodies 61 are embedded in an encapsulation body 6. The encapsulation body 6 may be made of the same material as the chip encapsulation bodies 61. Furthermore, it is possible that both encapsulation bodies 6, 61 are formed of the same matrix material but have different fillers. Thus, each chip encapsulation body 61 may be formed to be reflective by adding reflective particles, whereas the encapsulation body 6 may be formed to be colored or black by adding absorbent particles, for example. A black encapsulation body 6 increases the contrast between the individual light-emitting semiconductor chips 11, 12, 13. The encapsulation body 6 can be further formed to be transparent and reflective coated (not shown).

Figure 2B:
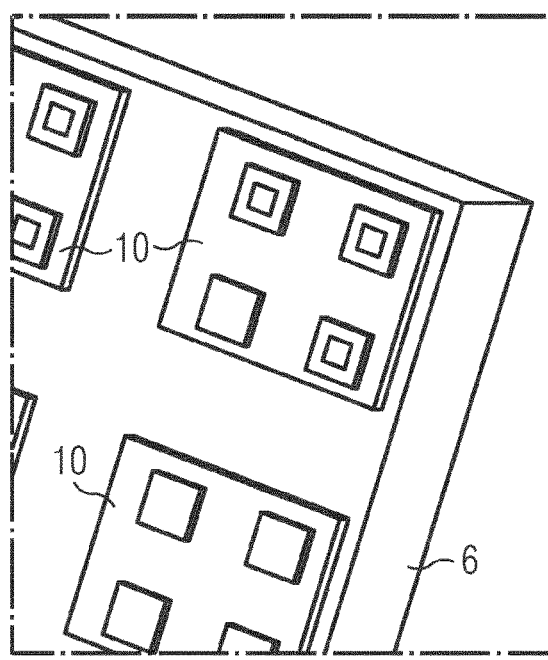
Figure 2C:
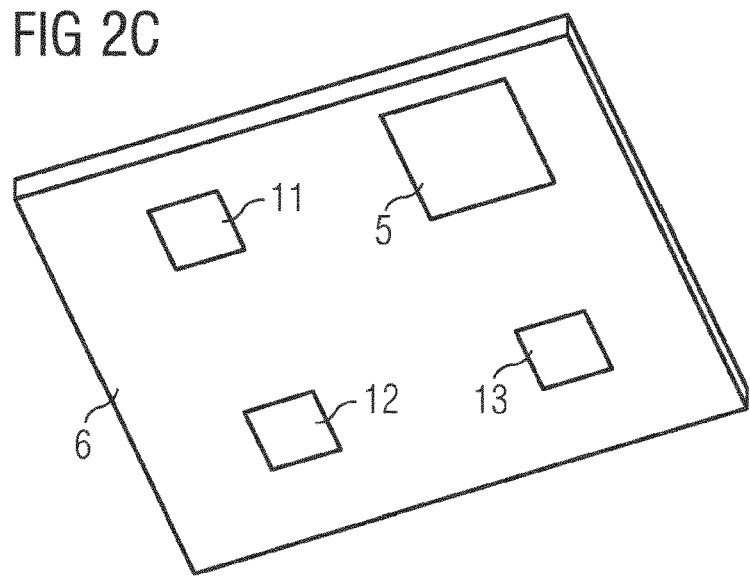

As shown in the schematic illustration of FIG. 2B, a plurality of light-emitting components 10 may be combined via the encapsulation body 6 to form a display device, for example.

In contrast to the exemplary embodiment of FIGS. 1A to 1D and FIGS. 2A to 2C, respectively, an exemplary embodiment of a light-emitting component 10 described herein is described in connection with FIG. 3, in which the light-emitting semiconductor chips 11, 12, 13 are surrounded in lateral directions by an electrically conductive lead frame 71 which is in direct mechanical and electrical contact with the transparent conductive layer 2. In this exemplary embodiment, the electrically conductive body 5 is connected to the electrically conductive lead frames 71 via conductor paths 7, which may be formed with the same material as the lead frames 71. In this case, the conductor paths 7 are in direct mechanical and electrical contact with the transparent conductive layer 2. The conductor paths 7 serve to optimize the conductivity and thus lead to a particularly low electrical resistance when connecting the semiconductor chips 11, 12, 13 with the conductive body 5.

Figure 3:
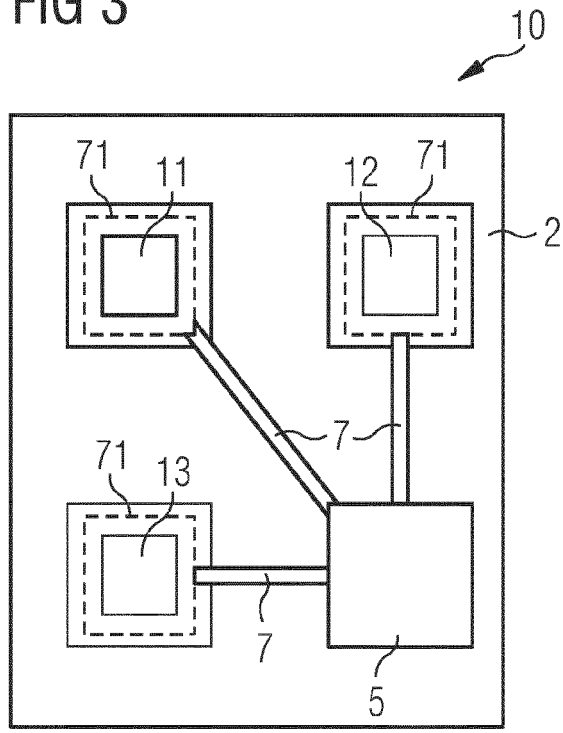
FIG. 3 illustrates an example of a third light-emitting component according to aspects of the present disclosure.
Figure 4:
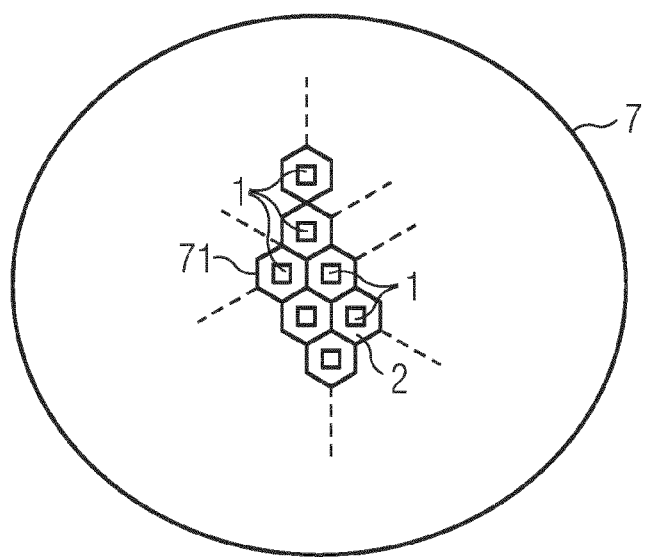
FIG. 4 illustrates an example of a fourth light-emitting component according to aspects of the present disclosure.

In contrast to the exemplary embodiment of FIG. 3, the exemplary embodiment of FIG. 4 shows a light-emitting component 10 comprising a plurality of light-emitting semiconductor chips 1 each emitting white light, for example. Each semiconductor chip 1 is surrounded by a hexagonal lead frame 71. The hexagonal lead frames 71 are electrically conductively connected to an annular conductor path 7 which laterally surrounds all lead frames 71. The semiconductor chips 1 are arranged at the grid points of a two-dimensional hexagonal grid and surrounded by the lead frames 71 in a honeycomb pattern. This structure permits a particularly loss-free current conduction and thus a particularly efficient connection of the plurality of light-emitting semiconductor chips of the component 10.

In connection with the schematic illustrations of FIGS. 5A to 5F, a further exemplary embodiment of a light-emitting component 10 described herein is explained in more detail. In this exemplary embodiment, the light-emitting component 10 comprises, for example, in addition to the exemplary embodiment of FIGS. 2A to 2C, an active element 8, wherein the transparent conductive layer 2 covers the active element 8 at least in places and the active element is electrically conductively connected to the light-emitting semiconductor chips 11, 12, 13. It is possible, as shown in connection with FIG. 5B, that an active element 8 is arranged between each two light-emitting semiconductor chips 11, 12, 13.

The active element 8 is in particular a thin-film transistor. The active element 8 can comprise a gate terminal 81 and source terminals 82, 83, 84, see FIG. 5D.

Figure 5A:
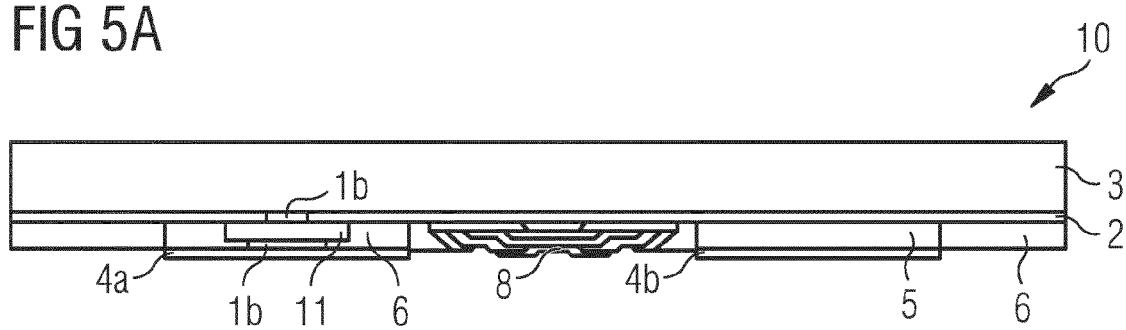
FIGS. 5A-5F illustrate an example of a fifth light-emitting component according to aspects of the present disclosure.
Figure 5B:
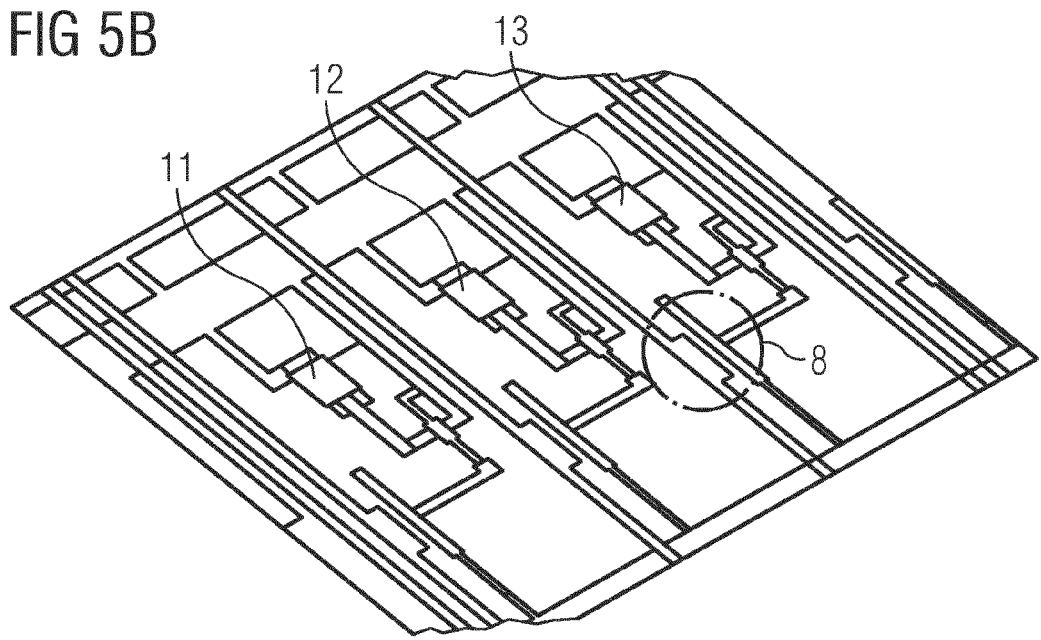
Figure 5C:
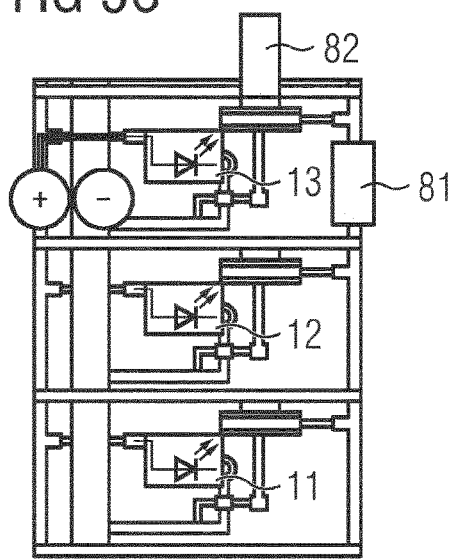
Figure 5D:
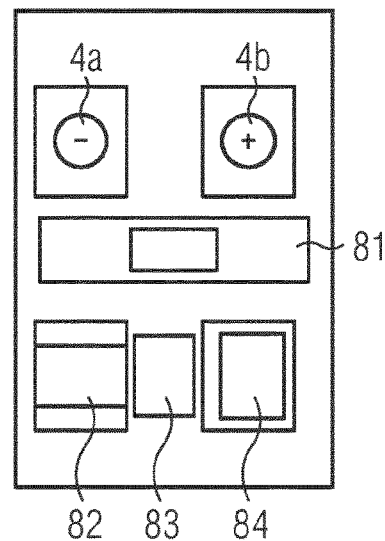
Figure 5E:
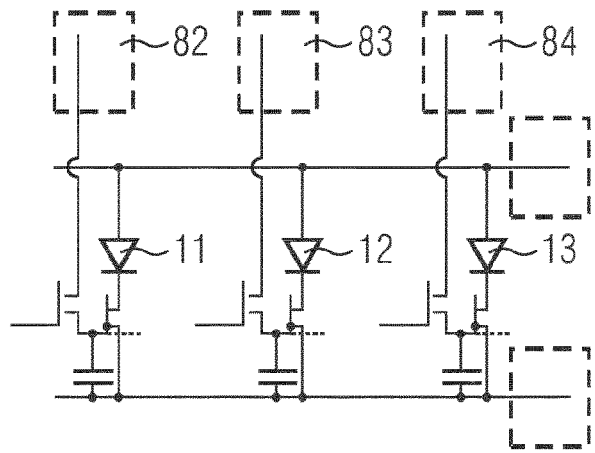

A possible interconnection of the active elements 8 with the light-emitting semiconductor chips 11, 12, 13 is shown in FIG. 5E.

Figure 5F:
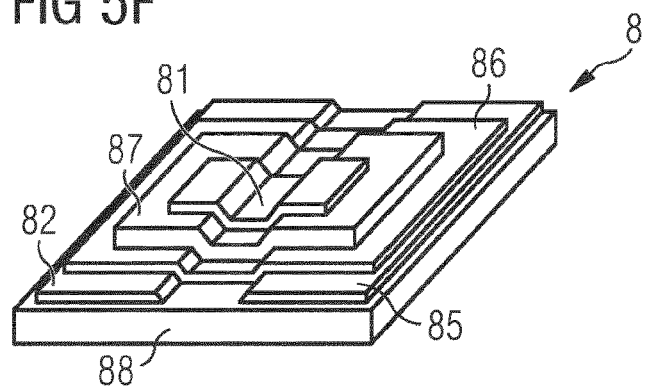

FIG. 5F shows the basic structure of an active element 8 designed as a thin-film transistor with a substrate 88, a source terminal 82, a drain terminal 85, a semiconductor layer 86, an electrically insulating layer 87, which is formed by a dielectric, for example.

As can be seen from the schematic sectional view of FIG. 5A, the active element 8 can be completely covered by the encapsulation body 6 on the side facing away from the electrically conductive layer 2, so that it is particularly well protected mechanically and chemically.

The individual semiconductor chips 11, 12, 13 can be controlled independently of one another via the active element 8. One or more active elements 8 can be used in any embodiment of the light-emitting components described here.

Figure 6:
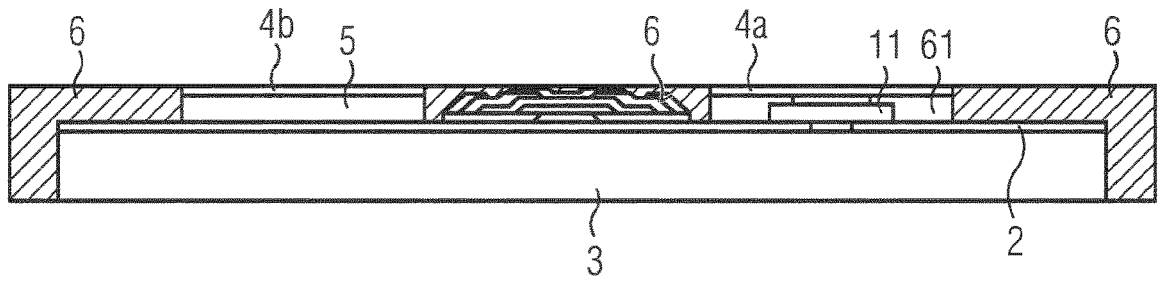
FIG. 6 illustrates an example of a sixth light-emitting component according to aspects of the present disclosure.

In connection with FIG. 6, another exemplary embodiment of a light-emitting component described herein is described. In contrast to the exemplary embodiment of FIGS. 5A to 5F, in this exemplary embodiment the encapsulation body 6 is also guided along the side surfaces of the carrier 3. In this way, the encapsulation body 6 protects the carrier 3 laterally and can contribute to the mechanical stabilization of the carrier 3. This makes it possible for the carrier 3 to be formed, for example, from a flexible material such as a transparent plastic film.

Figure 7:
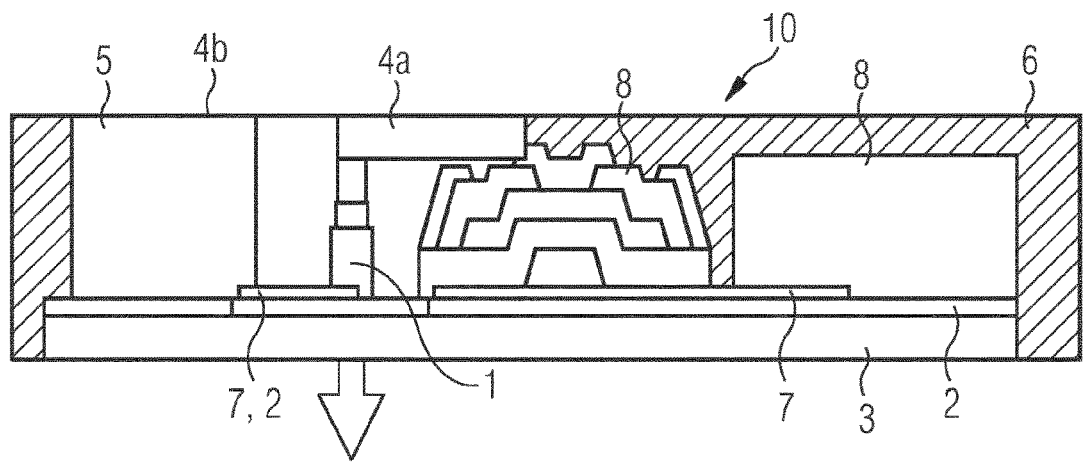
FIG. 7 illustrates a schematic sectional view of a light-emitting component according to aspects of the present disclosure.

In connection with the schematic sectional view of FIG. 7, a further exemplary embodiment of a light-emitting component described here is described. In this exemplary embodiment, the light-emitting semiconductor chip 1 and an active element 8 are electrically conductively connected to each other via a connection point 4a of the component 10. Furthermore, the light-emitting component comprises at least two active elements 8, wherein one of the active elements 8 is formed as a thin-film transistor and the other active element may be a switch, a resistor, a capacitor, an integral circuit or the like. The components can be interconnected, for example, via conductor paths 7, which can be in direct contact with the transparent conductive layer 2.

In connection with FIG. 8, a display device described herein is illustrated in which each pixel is formed by a light-emitting component 10 described herein. The light-emitting semiconductor chips 11, 12, 13 of each component 10 form the colored subpixels of each pixel.

Figure 9A:
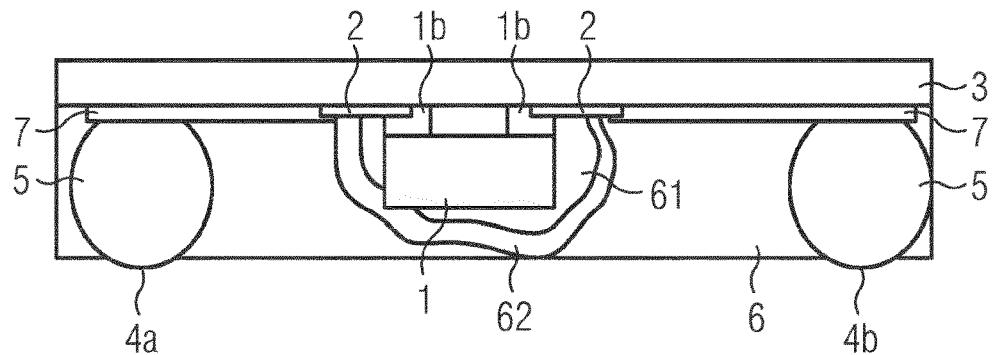
FIGS. 9A-9B illustrate first exemplary schematic sectional views of a light-emitting component according to aspects of the present disclosure.
Figure 9B:
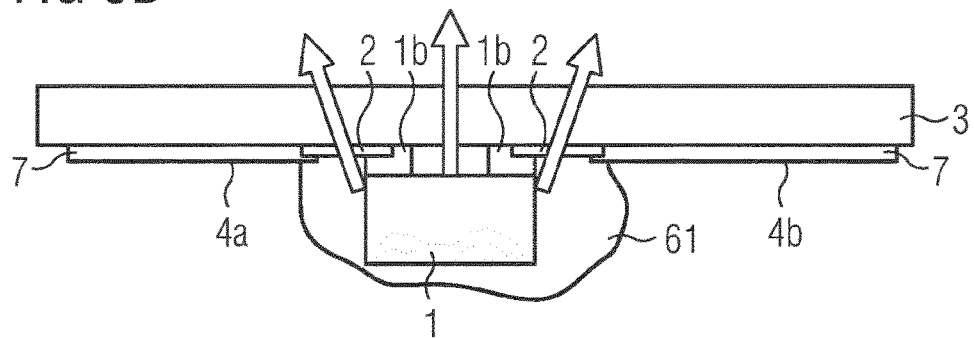

In connection with FIGS. 9A and 9B, further exemplary embodiments of light-emitting components described herein are explained in more detail. In the exemplary embodiment of FIG. 9A as well as in the exemplary embodiment of FIG. 9B, in each case a light-emitting semiconductor chip 1 is used in which the terminals 1b are located on a top surface. The terminals 1b are electrically conductively connected to the connection points 4a, 4b of the light-emitting component via the transparent conductive layer 2 and conductor paths 7.

In the exemplary embodiment shown in FIG. 9A, the connection points 4a, 4b are provided by a part of the outer surface of the electrically conductive bodies 5, which may be solder balls, for example.

In the exemplary embodiment shown in FIG. 9B, the connection points are formed by the outer surfaces of the conductor paths 7 facing away from the carrier 3.

In both exemplary embodiments, the light-emitting semiconductor chip 11 is surrounded by a chip encapsulation body 61, which is transparent in the embodiment of FIG. 9A. A reflector 62 is applied to the outer surface of the chip encapsulation body 61, which reflects electromagnetic radiation of the semiconductor chip 1 emitted during operation.

In the exemplary embodiment of FIG. 9B, the encapsulation body 61 itself is reflective, for example by adding electrically reflective particles such as titanium dioxide particles into a matrix material of the encapsulation body.

Figure 10A:
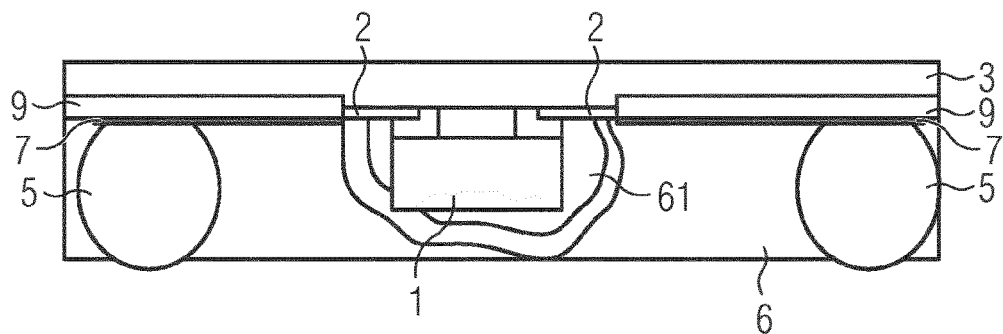
FIGS. 10A-10C illustrate second exemplary schematic sectional views of a light-emitting component according to aspects of the present disclosure.
Figure 10B:
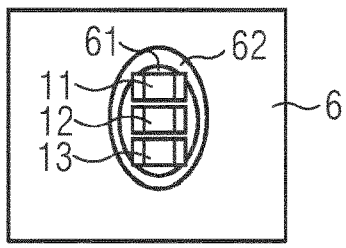
Figure 10C:
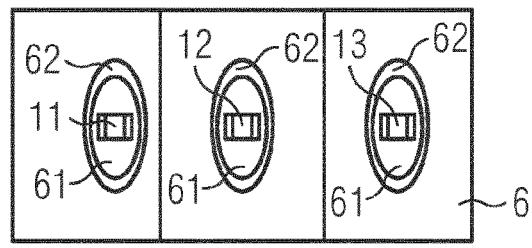

In the exemplary embodiments of FIGS. 10A, 10B and 10C, in contrast to the exemplary embodiment of FIG. 9A, for example, a screen 9 is arranged between the conductor paths 7 and the carrier 3, which has an opening in the region of the semiconductor chip 1 or the semiconductor chips 11, 12, 13, compare FIG. 10B. The screen can, for example, be formed with black window film. It increases the contrast to adjacent light-emitting semiconductor chips. The semiconductor chips 11, 12, 13 can either be encapsulated by a common chip encapsulation body 61 or, as shown in FIG. 10C, each have its own chip encapsulation body 61, which can be surrounded by a reflector 62.

In connection with the schematic illustrations of FIGS. 11A to 11D, a method of manufacturing a display device or light-emitting component described herein is explained in greater detail.

Figure 11A:
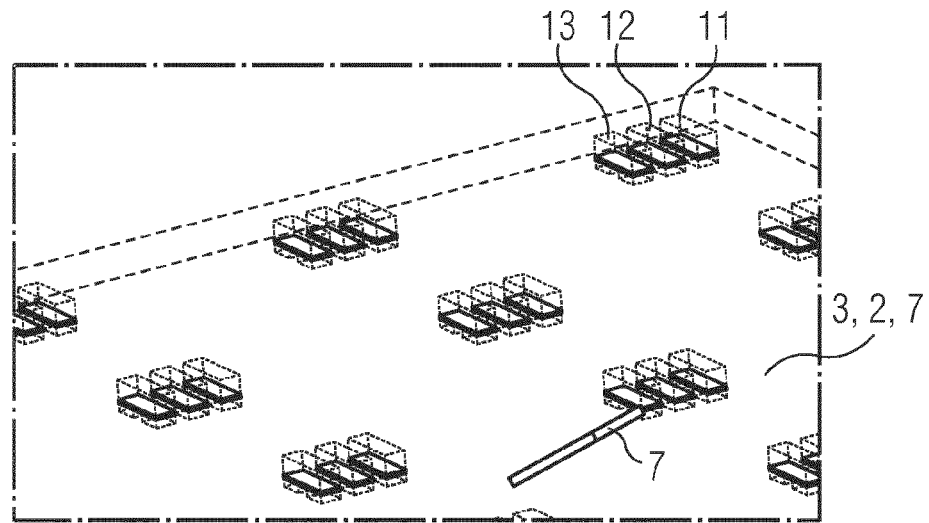
FIGS. 11A-11D illustrate an example of process steps for manufacturing a light-emitting component according to aspects of the present disclosure.
Figure 11B:
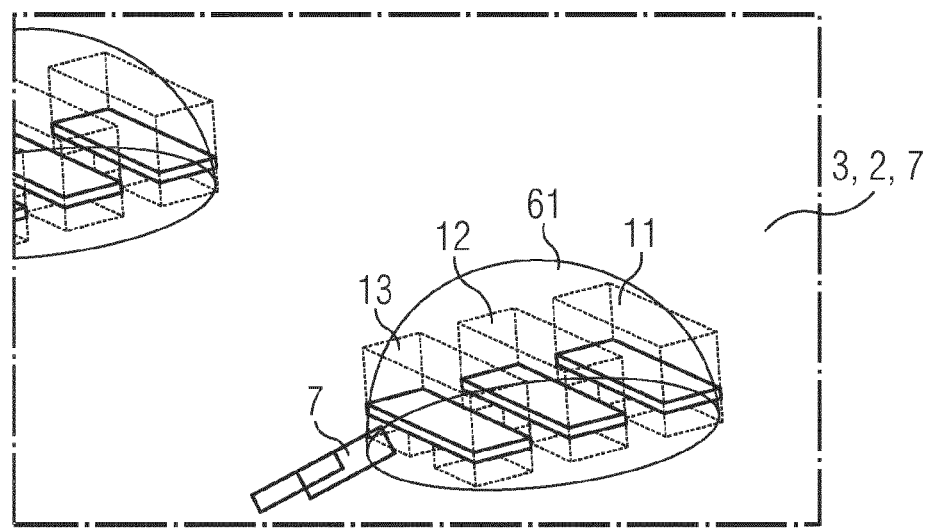

First, the light-emitting semiconductor chips 11, 12, 13 are placed on the carrier 3, which is already provided with the light-emitting layer 2 and conductor paths 7. This is shown in FIG. 11A. In the next step, FIG. 11B, a chip encapsulation body 61 can be applied, for example, over three light-emitting semiconductor chips 11, 12, 13 each. For example, the application is performed by spreading silicone drops forming the chip encapsulation bodies 61.

Figure 11C:
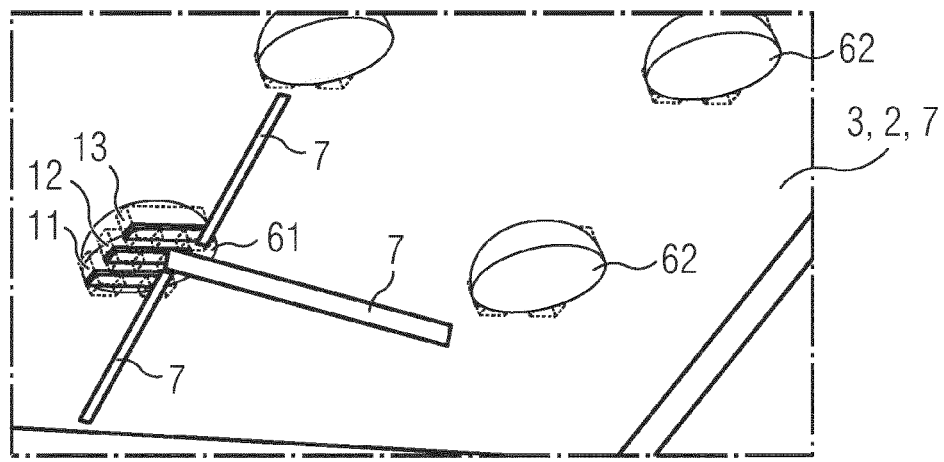
Figure 11D:
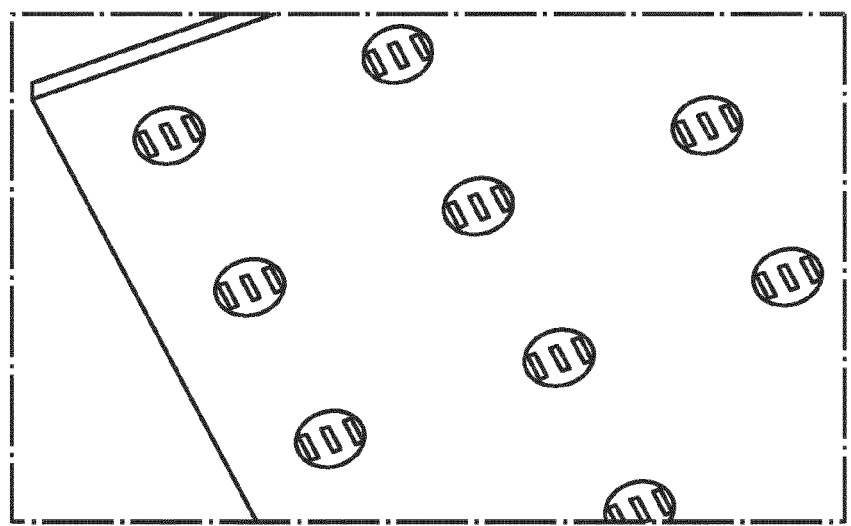

In the next method step, FIG. 11C, the chip encapsulation bodies 61 are provided with a reflector 62, for example by means of a sprayed plastic layer. The remaining areas on the side of the electrically conductive layer 2 facing away from the carrier 3 are either photolithographically permanently black or temporarily covered with a layer, FIG. 11D.

In connection with FIGS. 12A and 12B, schematic illustrations of radiation-emitting semiconductor chips are described, such as may be used in light-emitting components described herein or in display devices described herein. In connection with FIG. 12A, a semiconductor chip is described in which a substrate 1a, for example a sapphire substrate, is provided on the side of the semiconductor layer 1c facing away from the terminals 1b.

In the exemplary embodiment of FIG. 1B, such a growth substrate 1b is removed so that the semiconductor chip is free of a substrate.

In connection with the exemplary embodiment of FIG. 13, a further exemplary embodiment of a light-emitting component 10 described here is explained in more detail. In this exemplary embodiment, the electrically conductive bodies 5 are formed as solder bumps. They are connected to the conductor paths 7 via the metal layers 89, which are formed, for example, by a metal layer sequence such as Cr/Cr-Cu/Cu—Au or TiW/Cu/Au. The metal layers 89 are an under bump metallization (UBM). The metallization surrounds the conductive body 5 in places in lateral directions and prevents diffusion of material from the conductive body 5 into other areas of the light-emitting component 10.

The features and exemplary embodiments described in connection with the figures can be combined with each other according to further exemplary embodiments, even if not all combinations are explicitly described. Furthermore, the exemplary embodiments described in connection with the figures may alternatively or additionally have further features according to the description in the general part.

This patent application claims the priority of German patent application 102019112733.5, the disclosure content of which is hereby incorporated by reference.

The invention is not limited to the exemplary embodiments by the description based on the same. Rather, the invention encompasses any new feature as well as any combination of features, which in particular includes any combination of features in the claims, even if that feature or combination itself is not explicitly stated in the claims or embodiments.

LIST OF REFERENCE SIGNS

1, 11, 12, 13 semiconductor chip
1a substrate
1b terminal
1c semiconductor layer 2 transparent conductive layer
3 transparent carrier
4, 4a, 4b connection point
5 conductive body
6 encapsulation body
61 chip encapsulation body
62 reflector
7 conductor paths
71 lead frame
8 active element
81 gate
82, 83, 84 source
85 drain
86 semiconductor layer
87 dielectric
88 substrate
89 metal layers
9 screen
10 component
H vertical dimension
B first lateral dimension
L second lateral dimension

The invention claimed is:

1. A light-emitting component comprising
a light-emitting semiconductor chip,
a transparent conductive layer,
at least two electrical connection points,
a conductive body which is covered by the transparent conductive layer at least in places and is electrically conductively connected thereto, wherein one of the at least two electrical connection points covers the conductive body in places on its underside facing away from the transparent conductive layer, or the underside of the conductive body forms one of the at least two electrical connection points, and
an encapsulation body, wherein
the transparent conductive layer covers the light-emitting semiconductor chip at least in places,
the transparent conductive layer is located above the light-emitting semiconductor chip and the electrical connection points are located below the light-emitting semiconductor chip,
the encapsulation body covers the light-emitting semiconductor chip and the transparent conductive layer at least in places, and
the light-emitting semiconductor chip is electrically conductively connected to the conductive body via the transparent conductive layer.

2. The light-emitting component according to claim 1, comprising a transparent carrier which completely covers the transparent conductive layer, the light-emitting semiconductor chip and the electrical connection points.

3. The light-emitting component according to claim 2, in which the encapsulation body covers the transparent carrier in places.

4. The light-emitting component according to claim 1, in which the light-emitting semiconductor chip is arranged between one of the at least two electrical connection points and the transparent conductive layer, wherein this electrical connection point projects beyond the light-emitting semiconductor chip in lateral directions.

5. The light-emitting component according to claim 1, in which the light-emitting semiconductor chip is completely surrounded by a chip encapsulation body in lateral directions, and
the light-emitting semiconductor chip is arranged between one of the at least two electrical connection points and the transparent conductive layer, wherein this electrical connection point covers an underside of the chip encapsulation body facing away from the transparent conductive layer.

6. The light-emitting component according to claim 1, in which the light-emitting semiconductor chip is surrounded in lateral directions by an electrically conductive lead frame which is in direct mechanical and electrical contact with the transparent conductive layer.

7. The light-emitting component according to claim 6, in which the electrically conductive lead frame is electrically conductively connected to a conductive body via a conductor path, the conductor path being in direct mechanical and electrical contact with the transparent conductive layer.

8. The light-emitting component according to claim 1, comprising an active element, wherein the transparent conductive layer covers the active element at least in places and the active element is electrically conductively connected to the light-emitting semiconductor chip.

9. The light-emitting component according to claim 8, in which the active element is or comprises a thin-film transistor.

10. The light-emitting component according to claim 8, in which the encapsulation body covers the active element.

11. The light-emitting component according to claim 1, in which the light-emitting semiconductor chip is completely surrounded by a chip encapsulation body in lateral directions and on a side facing away from the transparent conductive layer.

12. The light-emitting component according to claim 11, in which the chip encapsulation body is covered by a reflector.

13. The light-emitting component according to claim 1, comprising two or more light-emitting semiconductor chips.

14. A display device comprising at least one light-emitting component according to claim 1.

15. A light-emitting component comprising
a light-emitting semiconductor chip;
a transparent conductive layer;
at least two electrical connection points; and
an encapsulation body,
wherein:
the transparent conductive layer covers the light-emitting semiconductor chip at least in places;
the transparent conductive layer is located above the light-emitting semiconductor chip and the electrical connection points are located below the light-emitting semiconductor chip;
the encapsulation body covers the light-emitting semiconductor chip and the transparent conductive layer at least in places;
the light-emitting semiconductor chip is completely surrounded by a chip encapsulation body in lateral directions and on a side facing away from the transparent conductive layer; and
the chip encapsulation body is covered by a reflector.

16. The light-emitting component according to claim 15, comprising a conductive body which is covered by the transparent conductive layer at least in places and is electrically conductively connected thereto, wherein one of the at least two electrical connection points covers the conductive body in places on its underside facing away from the transparent conductive layer, or the underside of the conductive body forms one of the at least two electrical connection points.

17. The light-emitting component according to claim 16, in which the light-emitting semiconductor chip is electrically conductively connected to the conductive body via the transparent conductive layer.

\* \* \* \* \*